(12) United States Patent
Wang et al.

(10) Patent No.: US 11,257,874 B2
(45) Date of Patent: Feb. 22, 2022

(54) ARRAY SUBSTRATE, PREPARATION METHOD THEREOF, DISPLAY PANEL AND DISPLAY DEVICE

(71) Applicant: BOE Technology Group Co., Ltd., Beijing (CN)

(72) Inventors: Guoying Wang, Beijing (CN); Zhen Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/910,590

(22) Filed: Jun. 24, 2020

(65) Prior Publication Data

US 2020/0321408 A1 Oct. 8, 2020

Related U.S. Application Data

(63) Continuation-in-part of application No. PCT/CN2019/126106, filed on Dec. 17, 2019.

(30) Foreign Application Priority Data

Jan. 2, 2019 (CN) .......................... 201910002593.8

(51) Int. Cl.
*H01L 27/32* (2006.01)
*H01L 27/12* (2006.01)
*H01L 31/18* (2006.01)

(52) U.S. Cl.
CPC ...... *H01L 27/3227* (2013.01); *H01L 27/1214* (2013.01); *H01L 27/1259* (2013.01); *H01L 31/1888* (2013.01)

(58) Field of Classification Search
CPC ............. H01L 27/3227; H01L 27/1214; H01L 27/1259; H01L 27/3269; H01L 31/1888; H01L 31/02161; H01L 31/153
See application file for complete search history.

(56) References Cited

U.S. PATENT DOCUMENTS

| 5,326,712 A * | 7/1994 | Bae | H01L 21/02178 |
| | | | 438/158 |
| 2008/0006828 A1 * | 1/2008 | Zhang | H01L 27/14665 |
| | | | 257/72 |

(Continued)

FOREIGN PATENT DOCUMENTS

| CN | 101976679 A | 2/2011 |
| CN | 104934481 A | 9/2015 |

(Continued)

OTHER PUBLICATIONS

Office Action dated May 20, 2020 for corresponding Chinese Application No. 201910002593.8.

(Continued)

*Primary Examiner* — Sitaramarao S Yechuri
(74) *Attorney, Agent, or Firm* — Arent Fox LLP; Michael Fainberg

(57) ABSTRACT

Disclosed are an array substrate, a preparation method thereof, a display panel and a display device. The array substrate includes a base substrate, a first thin film transistor, a photosensitive sensor, and a dielectric layer. The first thin film is on the base substrate and includes a gate, a drain, a source and a conductive channel between the drain and the source. The photosensitive sensor has the drain of the first thin film transistor as an electrode of the photosensitive sensor. The dielectric layer covers the conductive channel of the first thin film transistor, where the dielectric layer is a metal oxide film.

8 Claims, 3 Drawing Sheets

(56) References Cited

U.S. PATENT DOCUMENTS

| | | | |
|---|---|---|---|
| 2008/0151161 A1* | 6/2008 | Kim | G01J 3/513 |
| | | | 349/116 |
| 2009/0026509 A1* | 1/2009 | Hayashi | H01L 27/14612 |
| | | | 257/292 |
| 2009/0115802 A1* | 5/2009 | Nakanishi | G09G 3/3648 |
| | | | 345/690 |
| 2011/0221720 A1 | 9/2011 | Kuo et al. | |
| 2014/0362319 A1* | 12/2014 | Sano | G02F 1/13318 |
| | | | 349/43 |
| 2015/0364527 A1 | 12/2015 | Wang et al. | |
| 2016/0064460 A1 | 3/2016 | Kim et al. | |
| 2018/0082856 A1 | 3/2018 | Liu | |
| 2019/0006396 A1 | 1/2019 | Duan et al. | |
| 2020/0321408 A1 | 10/2020 | Wang et al. | |

FOREIGN PATENT DOCUMENTS

| | | | |
|---|---|---|---|
| CN | 105374748 A | 3/2016 | |
| CN | 107331708 A | 11/2017 | |
| CN | 107346789 A | 11/2017 | |
| CN | 108878503 A | 11/2018 | |
| CN | 109728050 A | 5/2019 | |

OTHER PUBLICATIONS

Office Action dated Nov. 25, 2020 for corresponding Chinese Application No. 201910002593.8.

* cited by examiner

ARRAY SUBSTRATE, PREPARATION METHOD THEREOF, DISPLAY PANEL AND DISPLAY DEVICE

CROSS REFERENCE TO RELATED APPLICATION

This application claims priority to and is a continuation-in-part application of International Application No. PCT/CN2019/126106, filed on Dec. 17, 2019, designating the United States, and claiming the priority of Chinese Patent Application No. 201910002593.8, filed with the Chinese Patent Office on Jan. 2, 2019 and entitled "Array Substrate, Preparation Method thereof, Display Panel and Display Device", which are hereby incorporated by reference in their entireties.

FIELD

The present disclosure relates to the technical field of displays, and in particular, relates to an array substrate, a preparation method thereof, a display panel and a display device.

BACKGROUND

As the demand of AMOLEDs increases in recent years, market demand on the parameters becomes higher. Brightness is one of important indicators, which matters to a good user experience. As such, customers often put forward higher requirements on brightness uniformity. If the brightness of an entire screen is not uniform, then the brightness of the entire screen is compensated.

SUMMARY

In a first aspect, an embodiment provides an array substrate. The array substrate includes a base substrate, a first thin film transistor, a photosensitive sensor, and a dielectric layer. The first thin film is on the base substrate and includes a gate, a drain, a source and a conductive channel between the drain and the source. The photosensitive sensor has the drain of the first thin film transistor as an electrode of the photosensitive sensor. The dielectric layer covers the conductive channel of the first thin film transistor, where the dielectric layer is a metal oxide film.

In some embodiments, the metal used for forming the dielectric layer and the drain of the first thin film transistor are in the same metal layer.

In a second aspect, a display panel is provided, the display panel including an array substrate in any embodiments provided in the first aspect, where the photosensitive sensor and the first thin film transistor are in a non-display area of the display panel.

In some embodiments, the display panel is an OLED display panel; the array substrate further includes a light emitting device located in a display area, and a second thin film transistor connected to the light emitting device; and the first thin film transistor and the second thin film transistor are in the same film layer.

In some embodiments, the display panel is an LCD display panel, and the array substrate further includes a third thin film transistor located in a display area, and the first thin film transistor and the third thin film transistor are in the same film layer.

In third aspect, an embodiment of the present disclosure provides a display device, the display device including a display panel in any embodiments provided in the second aspect.

In a fourth aspect, an embodiment of the present disclosure provides a preparation method of an array substrate. The method includes: forming a gate, a gate insulating layer, and an active layer successively on a base substrate; forming a metal layer pattern on the active layer, where the metal layer pattern includes a source, a drain, and a region covering a conductive channel; forming a dielectric layer by anodic oxidation on the region covering the conductive channel in the metal layer pattern; and forming a photosensitive sensor on the drain.

In some embodiments, forming a dielectric layer by anodic oxidation on the region covering the conductive channel in the metal layer pattern includes: forming a photoresist layer on the metal layer pattern; patterning the photoresist layer to expose the region covering the conductive channel in the metal layer pattern; and performing anodic oxidation on the region covering the conductive channel in the metal layer pattern by using the patterned photoresist layer as a shield, to form the dielectric layer.

In some embodiments, forming a dielectric layer by anodic oxidation on the region covering the conductive channel in the metal layer pattern includes: forming a metal oxide thin film on a surface of the region covering the conductive channel in the metal layer pattern, via an electrolysis process in a constant current constant voltage mode using a citric acid solution at normal pressure and room temperature.

In some embodiments, forming a photosensitive sensor on the drain includes: forming a phosphorous or arsenic doped semiconductor layer, an intrinsic semiconductor layer, a boron-doped semiconductor layer, and a transparent conductive oxide layer successively on the drain; and with the same mask, patterning the transparent conductive oxide layer by wet etching, and patterning the phosphorus or arsenic doped semiconductor layer, the intrinsic semiconductor layer, and the boron-doped semiconductor layer by dry etching to form the photosensitive sensor.

DETAILED DESCRIPTION OF THE EMBODIMENTS

Figure 1:
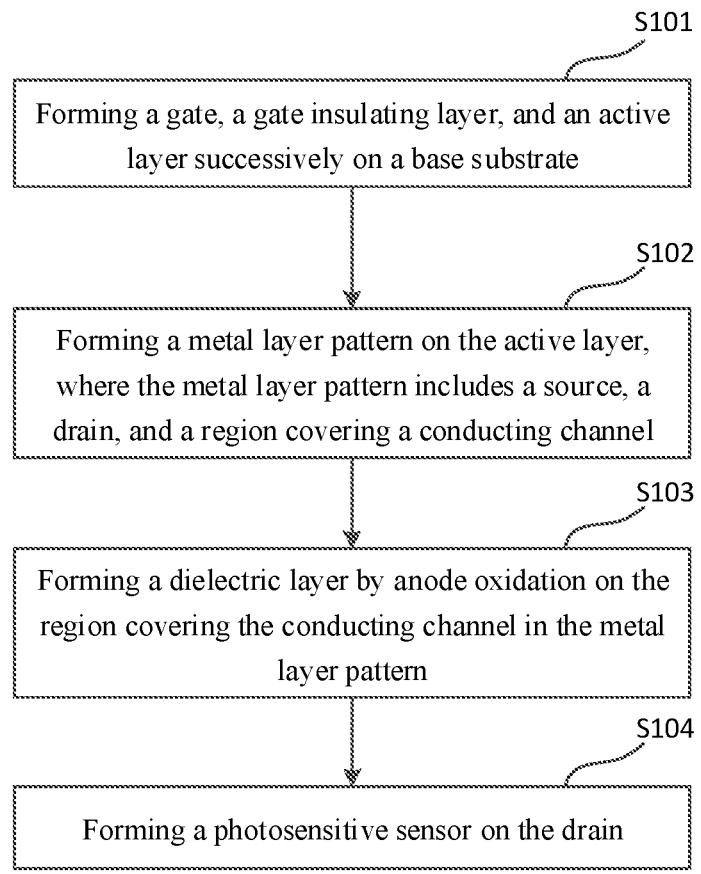
FIG. 1 is a schematic flow diagram of a preparation method of an array substrate provided in an embodiment of the present disclosure.

At present, methods for screen brightness compensation mainly include internal compensation and external compensation methods. The internal compensation method refers to that before an Organic Light Emitting Diode (OLED) emits light, a threshold voltage and mobility of a Thin Film Transistor (TFT) are compensated by a capacitance inside a display panel. However, the compensation range in this method is relatively small. The external compensation method refers to that a compensation circuit is additionally provided outside a TFT to monitor a threshold voltage for driving the TFT in real time, where the compensation is achieved by rewriting a voltage. Compared with the internal compensation method, the external compensation method may achieve a larger range of compensation.

However, the above two compensation methods can only compensate for display brightness unevenness caused by changes in the threshold voltage and mobility of the TFT, but cannot compensate for brightness changes caused by aging of display devices.

As can be seen, there is a technical problem in the related art that the brightness uniformity of an entire screen deteriorates due to aging of display devices.

To make the objects, technical solutions and advantages of the present disclosure more apparent, the technical solutions in the embodiments of the present disclosure will be described clearly and completely with reference to the drawings in the embodiments of the present disclosure.

Generally, the more uniform the brightness of a screen of a display device, the better. However, the brightness of a display device such as an OLED display panel is not uniform. Therefore, the brightness of the entire screen needs to be compensated. Methods for screen brightness compensation at present mainly include the internal compensation method and the external compensation method as described above, but the above two compensation methods cannot compensate for brightness changes caused by aging of display devices.

In view of this, in an embodiment of the present disclosure, a photosensitive sensor connected to a first thin film transistor is provided in an array substrate. The photosensitive sensor detects the actual luminance brightness of pixels of a display panel provided with the array substrate in real time, thereby compensating for the brightness of the display panel in real time to improve the uniformity of the brightness. Moreover, a dielectric layer of a metal oxide film covers a conductive channel of the first thin film transistor. The dielectric layer may prevent hydrogen gas from permeating into a region under the conductive channel to cause an adverse effect on the array substrate, where the hydrogen gas is introduced during preparation of the photosensitive sensor on a drain of the first thin film transistor and electrically connected to the drain.

Specific implementations of an array substrate, a preparation method thereof, and a display device provided in embodiments of the present disclosure will be described in detail below with reference to the drawings.

The thickness and shape of each film layer in the drawings do not reflect the true scale, and are merely intended to illustrate the present disclosure.

Referring to FIG. 1, in conjunction with FIGS. 2 to 5, an embodiment of the present disclosure provides a preparation method of an array substrate. As shown in FIG. 1, the specific process of the preparation method is as follows.

Step S101: forming a gate 201, a gate insulating layer 202, and an active layer 204 successively on a base substrate 20.

In preparation of the array substrate in the embodiment of the present disclosure, a first thin film transistor is prepared first. Specifically, referring to FIG. 2, a gate 201, a gate insulating layer 202, and an active layer 204 may be formed successively on a base substrate 20. In some embodiments, a metal layer may be deposited on the glass, then a photoresist layer is coated on the metal layer, and the photoresist layer is patterned to form a pattern of the gate 201. The material of the metal layer may be a common metal such as Mo, Al, Ti, Au, Cu, Hf, or Ta, and may also be a Cu alloy, such as a MoNd/Cu/MoNd metal layer formed by a Cu process.

The gate insulating layer 202 (GI layer) and an Act layer are successively deposited on the gate 201, and then the Act layer is patterned by wet etching to form the active layer 204. The material of the GI layer may be silicon oxide, silicon nitride, silicon oxynitride or other insulating material, and the material of the Act layer may be a metal oxide material, such as an IGZO material.

Step S102: forming a metal layer pattern on the active layer 204, where the metal layer pattern includes a source 205, a drain 206, and a region covering a conductive channel.

After the active layer 204 is prepared in the embodiment of the present disclosure, a metal layer may be deposited on the active layer 204. The material of the metal layer may be a metal such as Mo, Al, Ti, Au, Hf, or Ta, or an alloy of some of the metals. A metal layer pattern is formed by patterning the metal layer. The formed metal layer pattern includes a source 205, a drain 206, and a region covering a conductive channel.

Step S103: forming a dielectric layer 207 by anodic oxidation on the region covering the conductive channel in the metal layer pattern.

Here, anodic oxidation is an accelerated electrochemical oxidation process. It involves the application of an electrical bias at relatively low currents while the substrate is immersed in an acid bath. The films can be very dense and stable, with a variety of microstructural characteristics.

Figure 2:
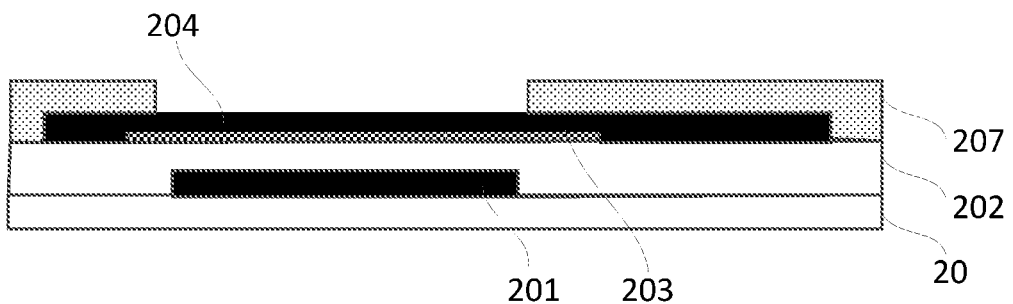
FIG. 2 is a schematic structural diagram of an array substrate provided in an embodiment of the present disclosure.
Figure 3:
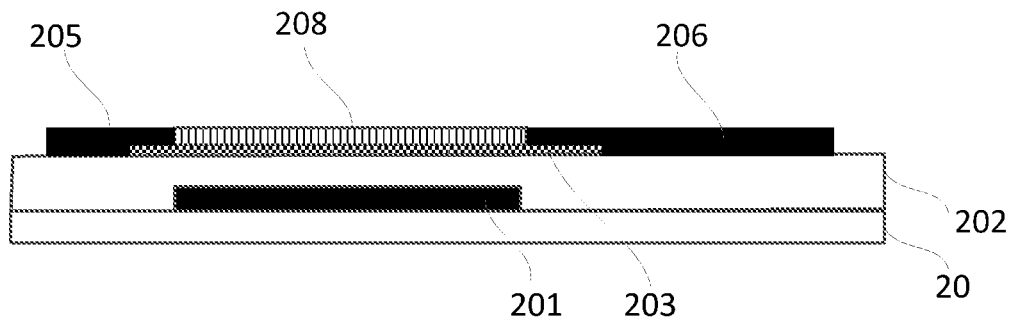
FIG. 3 is another schematic structural diagram of an array substrate provided in an embodiment of the present disclosure.

As shown in FIG. 2, in the embodiment of the present disclosure, a photoresist layer 207 may be formed on the metal layer pattern. The photoresist layer 207 is patterned to expose the region covering the conductive channel in the metal layer pattern, and then anodic oxidation is performed on the region covering the conductive channel in the metal layer pattern by using the patterned photoresist layer 207 as a shield, to form a dielectric layer 208, thus obtaining a first thin film transistor as shown in FIG. 3.

In some embodiments, the anodic oxidation may be performed via an electrolysis process in a constant current constant voltage mode using a citric acid solution at normal pressure and room temperature to form a metal oxide thin film on the surface of the region covering the conductive channel in the metal layer pattern, such as a metal oxide thin film of a high-K medium such as aluminum oxide, hafnium oxide, tantalum oxide, or zirconium oxide, thus obtaining a dielectric layer 208. As the dielectric layer 208 is a metallic oxide film, it has high compactness and may block a gas or the like from penetrating into the lower part of the first thin film transistor through the conductive channel to cause an adverse effect on the array substrate.

Step S104: forming a photosensitive sensor on the drain 206.

Figure 4:
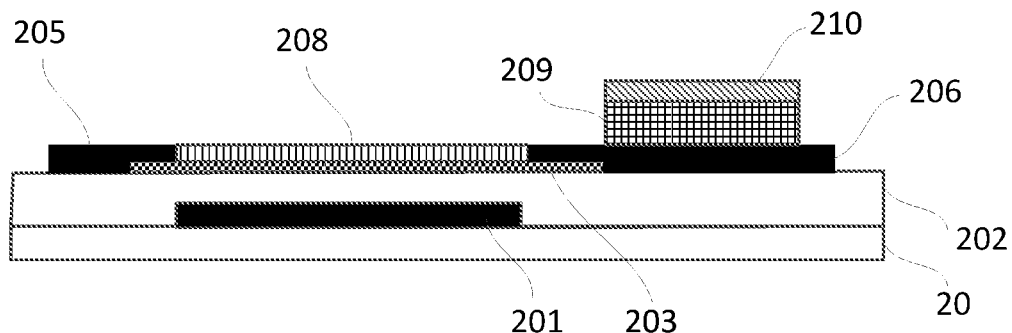
FIG. 4 is yet another schematic structural diagram of an array substrate provided in an embodiment of the present disclosure.

After the first thin film transistor is prepared in the embodiment of the present disclosure, a photosensitive sensor 209 may be formed on the drain 206 of the first thin film transistor. Specifically, a phosphorous or arsenic doped semiconductor layer, an intrinsic semiconductor layer, a boron-doped semiconductor layer, and a transparent conductive oxide layer 210, such as an ITO layer, may be formed successively on the drain 206. With the same mask, the transparent conductive oxide layer 210 is patterned by wet etching, the phosphorus or arsenic doped semiconductor layer, the intrinsic semiconductor layer, and the boron-doped semiconductor layer are patterned by dry etching to form a photosensitive sensor 209 as shown in FIG. 4, thus obtaining an array substrate provided in an embodiment of the present disclosure.

In preparation of the array substrate in the embodiment of the present disclosure, the first thin film transistor is prepared before the photosensitive sensor 209. As the conductive channel of the first thin film transistor is provided with the dielectric layer 208 formed by anodic oxidation of a metal, and the dielectric layer 208 has high compactness, the hydrogen gas introduced in the subsequent process of preparing the photosensitive sensor 209 may be blocked from entering the lower part of the first thin film transistor through the conductive channel to affect the array substrate. Furthermore, the photosensitive sensor 209 is prepared after the first thin film transistor as a whole is prepared in the embodiment of the present disclosure, which may avoid an influence on a sidewall of the photosensitive sensor during the wet-etching patterning process in the preparation of the first thin film transistor, so as to reduce a device leakage current.

After the photosensitive sensor 209 is prepared in the embodiment of the present disclosure, a PVX protective layer 211 may be deposited. The PVX protective layer 211 is patterned to form via holes, where the material of the PVX protective layer 211 may be an insulating material such as silicon oxide, silicon nitride, or silicon oxynitride. A projection of each via hole on the base substrate 20 is located on a projection of a pixel definition layer of the base substrate 20 on the base substrate 20. A layer of ITO electrode 212 is deposited and patterned on a side of the photosensitive sensor 209 facing away from the base substrate 20 to form a structure shown in FIG. 5.

The array substrate provided in the embodiment of the present disclosure may be applied to top-emitting cover glass or bottom-emitting cover glass. Subsequent process steps for preparing an array substrate are introduced below by using an array substrate provided in the embodiment of the present disclosure applied to top-emitting cover glass as an example.

Figure 5:
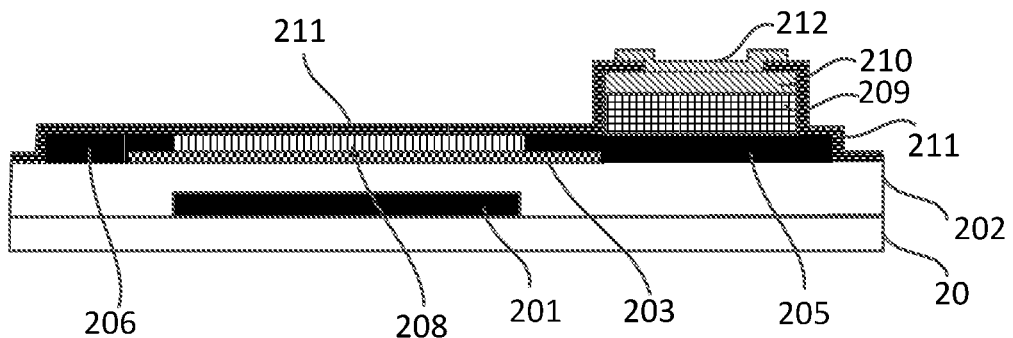
FIG. 5 is still yet another schematic structural diagram of an array substrate provided in an embodiment of the present disclosure.
Figure 6:
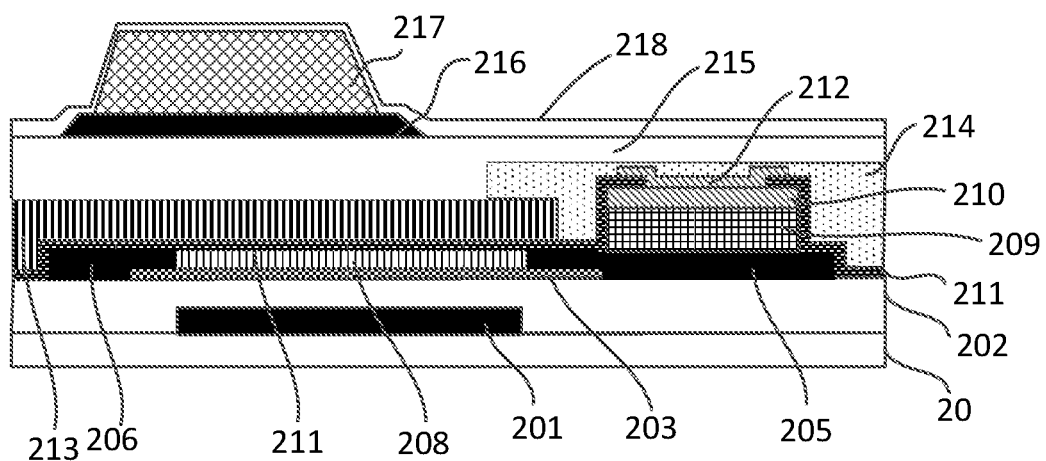
FIG. 6 is a further schematic structural diagram of an array substrate provided in an embodiment of the present disclosure.

In some embodiments, after the array substrate shown in FIG. 5 is obtained in the embodiment of the present disclosure, a black matrix BM213 may be further deposited and patterned on the PVX protective layer 211 so that the BM213 covers the active matrix TFT. A color film CF layer 214 is deposited on the ITO layer 212 on the photosensitive sensor. Specifically, in preparation of the CF layer 214, R, G, and B color films are successively deposited so that the color films cover the BM213 to some extent. Then, an OC layer 215 and an auxiliary electrode 216 may be deposited and patterned on the upper surface of the array substrate obtained after preparation of the BM213 and the CF layer 214. The material of the auxiliary electrode 216 may be a common metal such as Mo, Al, Ti, Au, Cu, Hf, or Ta, or may also be an alloy such as AlNd, or MoNb, or may also be multiple layers of metals, such as metal layers of MoNb/Cu/MoNb, or AlNd/Mo/AlNd. Then, a support PS (Photo Spacer) layer may be deposited and a support 217 is formed, and then a layer of transparent conductive oxide TCO film 218 is deposited as a transparent cathode. Where the material of the transparent conductive oxide film 218 may be a common material such as AZO, IZO, or AZTO, or a combination of these materials, thus completing preparation of the cover part, and obtain a structure shown in FIG. 6.

Further referring to FIG. 4, based on the same inventive concept, an embodiment of the present disclosure further provides an array substrate prepared by the above preparation method. The array substrate includes a base substrate 20, a first thin film transistor on the base substrate 20, and a photosensitive sensor 209 connected to the first thin film transistor. Where the photosensitive sensor 209 is on a drain 206 of the first thin film transistor and electrically connected to the drain 206, and a dielectric layer 208 is formed by anodic oxidation of a metal on a conductive channel of the first thin film transistor.

In specific implementation of the above-mentioned array substrate provided in the embodiment of the present disclosure, the metal used for forming the dielectric layer 208 and the drain 206 of the first thin film transistor may be in the same metal layer.

Specifically, further referring to FIG. 4, the array substrate further includes a gate 201, a gate insulating layer 202 and an active layer 204 on the base substrate 20, and a metal layer on a side of the active layer 204 facing away from the base substrate 20. The metal layer may include a source 205, a drain 206, and a region covering a conductive channel. Anodic oxidation is performed on the region covering the conductive channel in the metal layer pattern to form the dielectric layer 208. That is, the metal used for forming the dielectric layer 208 and the drain 206 of the first thin film transistor are in the same metal layer. The photosensitive sensor 209 is obtained by successively forming a phosphorus or arsenic doped semiconductor layer, an intrinsic semiconductor layer, and a boron-doped semiconductor layer on the drain 206.

Based on the same inventive idea, an embodiment of the present disclosure further provides a display panel, which includes an array substrate formed by the above preparation method, where the photosensitive sensor 209 and the first thin film transistor are in a non-display area of the display panel.

The array substrate provided in an embodiment of the present disclosure may be applied to the display field. For example, it may be made into an OLED. The display panel may also be made into an LCD display panel. In some embodiments, the display panel is an OLED display panel, and the array substrate may further include a light emitting device located in a display area, and a second thin film transistor connected to the light emitting device. The first thin film transistor and the second thin film transistor are in the same film layer. In some embodiments, the display panel is an LCD display panel, and the array substrate may further include a third thin film transistor located in a display area, and the first thin film transistor and the third thin film transistor are in the same film layer.

Of course, if the array substrate provided in the embodiment of the present disclosure is applied to the field of touch panels, the array substrate further includes components necessary for a touch panel, which will not be described in detail here.

Based on the same inventive idea, an embodiment of the present disclosure further provides a display device, which includes any above-mentioned display panel provided in an embodiment of the present disclosure. If a color effect is required for the display device, a color filter or other color device such as a quantum dot film may be provided in any layer or multiple layers of any panel of the display panel. The display device may be a mobile phone, a tablet computer, a television, a display, a notebook computer, a digital photo frame, a navigator, or any other product or component with display and touch functions. For the implementation of the display device, reference may be made to the embodiment of the above-mentioned array substrate, and repeated description is omitted here.

Evidently those skilled in the art may make various modifications and variations to the present disclosure without departing from the spirit and scope of the present disclosure. Thus, the present disclosure is also intended to encompass these modifications and variations thereto so long as the modifications and variations come into the scope of the claims appended to the present disclosure and their equivalents.

We claim:

1. An array substrate, comprising:
   a base substrate;
   a first thin film transistor on the base substrate, wherein the first thin film transistor comprises a gate, a drain, a source and a conductive channel between the drain and the source;
   a photosensitive sensor with the drain of the first thin film transistor as an electrode of the photosensitive sensor; and
   a dielectric layer covering the conductive channel of the first thin film transistor, wherein the dielectric layer is a metal oxide film;
   wherein the array substrate is arranged in an OLED display panel;
   wherein the array substrate further comprises:
      a light emitting device located in a display area of the OLED display panel; and
      a second thin film transistor connected to the light emitting device;
      wherein the first thin film transistor and the second thin film transistor are in a same film layer.

2. The array substrate according to claim 1, wherein the metal used for the dielectric layer and the drain of the first thin film transistor are in a same metal layer.

3. A display panel, comprising an array substrate, wherein the array substrate comprises:
   a base substrate;
   a first thin film transistor on the base substrate, wherein the first thin film transistor comprises a gate, a drain, a source and a conductive channel between the drain and the source;
   a photosensitive sensor with the drain of the first thin film transistor as an electrode of the photosensitive sensor; and
   a dielectric layer covering the conductive channel of the first thin film transistor, wherein the dielectric layer is a metal oxide film;
   wherein the photosensitive sensor and the first thin film transistor are in a non-display area of the display panel;
   wherein the display panel is an OLED display panel; and the array substrate further comprises:
      a light emitting device located in a display area; and
      a second thin film transistor connected to the light emitting device;
      wherein the first thin film transistor and the second thin film transistor are in a same film layer.

4. The display panel according to claim 3, wherein the display panel is an LCD display panel, and the array substrate further comprises:
   a third thin film transistor located in a display area, wherein the first thin film transistor and the third thin film transistor are in a same film layer.

5. A display device, comprising the display panel according to claim 3.

6. A preparation method of an array substrate, comprising:
   forming a gate, a gate insulating layer, and an active layer successively on a base substrate;
   forming a metal layer pattern on the active layer, wherein the metal layer pattern comprises a source, a drain, and a region covering a conductive channel;
   forming a dielectric layer by anodic oxidation on the region covering the conductive channel in the metal layer pattern; and
   forming a photosensitive sensor on the drain;
   wherein the said forming the dielectric layer by anodic oxidation on the region covering the conductive channel in the metal layer pattern comprises:
      forming a metal oxide thin film on a surface of the region covering the conductive channel in the metal layer pattern, via an electrolysis process in a constant current constant voltage mode using a citric acid solution at normal pressure and room temperature.

7. The method according to claim 6, wherein the said forming the dielectric layer by anodic oxidation on the region covering the conductive channel in the metal layer pattern comprises:
   forming a photoresist layer on the metal layer pattern;
   patterning the photoresist layer to expose the region covering the conductive channel in the metal layer pattern; and
   performing anodic oxidation on the region covering the conductive channel in the metal layer pattern by using the patterned photoresist layer as a shield, to form the dielectric layer.

8. The method according to claim 6, wherein the said forming a photosensitive sensor on the drain comprises:
   forming a phosphorous or arsenic doped semiconductor layer, an intrinsic semiconductor layer, a boron-doped semiconductor layer, and a transparent conductive oxide layer successively on the drain; and
   with a same mask, patterning the transparent conductive oxide layer by wet etching, and patterning the phosphorus or arsenic doped semiconductor layer, the intrinsic semiconductor layer, and the boron-doped semiconductor layer by dry etching to form the photosensitive sensor.

* * * * *